US007453173B2

(12) United States Patent
Suzuki et al.

(10) Patent No.: US 7,453,173 B2
(45) Date of Patent: Nov. 18, 2008

(54) ELECTROMECHANICAL TRANSFORMATION DEVICE

(75) Inventors: Nobukazu Suzuki, Kanagawa (JP); Gen Ichimura, Tokyo (JP); Masaru Uryu, Chiba (JP); Yoshio Ohashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 177 days.

(21) Appl. No.: 11/442,968

(22) Filed: May 31, 2006

(65) Prior Publication Data

US 2006/0276225 A1 Dec. 7, 2006

(30) Foreign Application Priority Data

Jun. 3, 2005 (JP) ............................ 2005-164827

(51) Int. Cl.
*H02N 2/00* (2006.01)
*H01L 41/12* (2006.01)

(52) U.S. Cl. ........................................................ 310/26

(58) Field of Classification Search .................... 310/26
See application file for complete search history.

(56) References Cited

U.S. PATENT DOCUMENTS

| | | | | |
|---|---|---|---|---|
| 6,240,176 | B1 * | 5/2001 | Lygas | 379/374.03 |
| 2003/0059069 | A1 * | 3/2003 | Bank et al. | 381/152 |
| 2004/0227721 | A1 * | 11/2004 | Moilanen et al. | 345/107 |
| 2005/0201584 | A1 * | 9/2005 | Smith | 381/376 |
| 2006/0113932 | A1 * | 6/2006 | Mori et al. | 318/114 |

* cited by examiner

*Primary Examiner*—J. SanMartin
*Assistant Examiner*—Derek J Rosenau
(74) *Attorney, Agent, or Firm*—Oblon, Spivak, McClelland, Maier & Neustadt, P.C.

(57) ABSTRACT

An electromechanical transformation device has a magnetostrictive actuator and a driving device that drives the magnetostrictive actuator. The driving device drives the magnetostrictive actuator based on any one of the vibration signal and the audio signal or mixed signal of them.

8 Claims, 7 Drawing Sheets

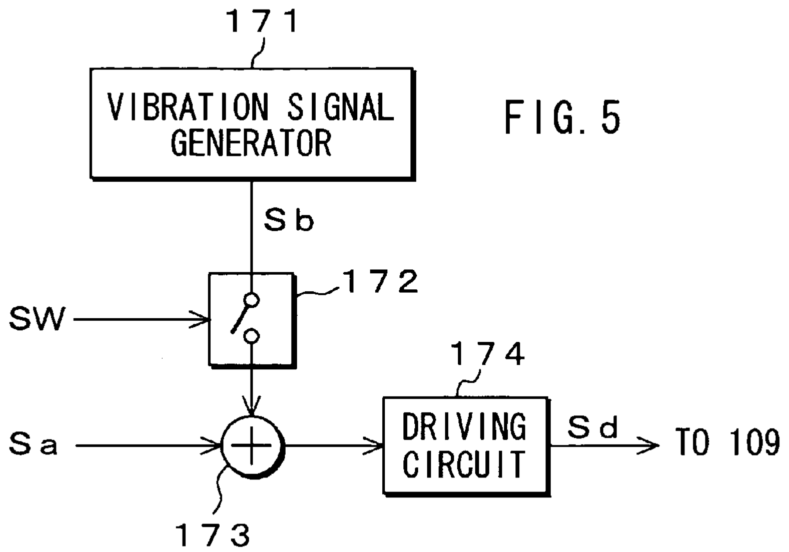
FIG. 5
FIG. 6A (Sb)
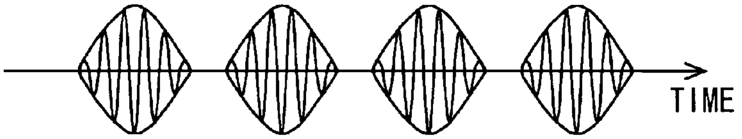
FIG. 6B (Sa)
FIG. 6C (Sa+Sb)
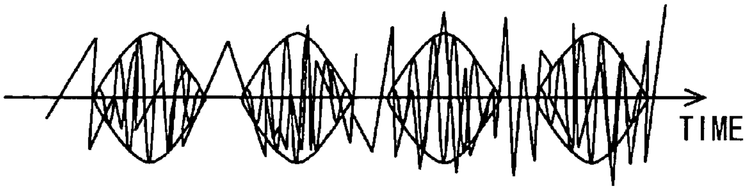

FIG. 7A (Sb)
FIG. 7B (Sa)
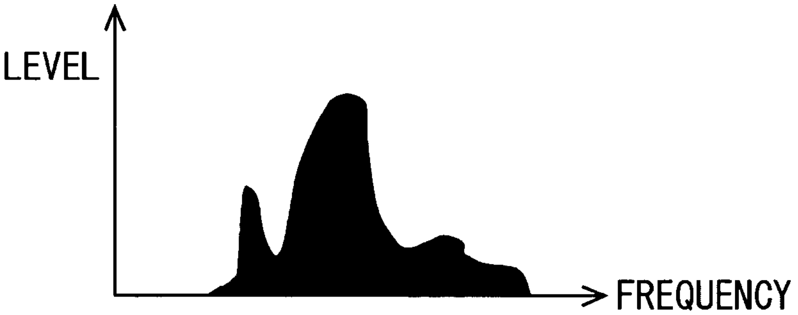
FIG. 7C (Sa+Sb)
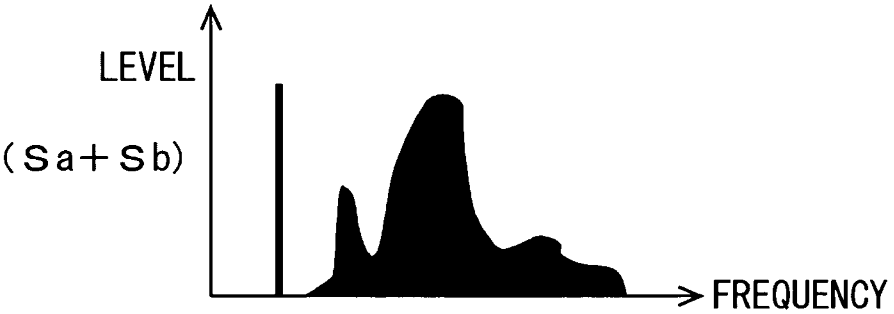

ELECTROMECHANICAL TRANSFORMATION DEVICE

CROSS REFERENCE TO RELATED APPLICATION

The present invention contains subject matter related to Japanese Patent Applications No. JP 2005-164827 filed in the Japanese Patent Office on Jun. 3, 2005, the entire contents of which being incorporated herein by reference.

BACKGROUND OF THE INVENTION

1. Field of the Invention

The present invention relates to an electromechanical transformation device that is preferably applicable to a mobile phone, a game machine and the like as well as an electromechanical transformation method and an electronics device using the electromechanical transformation device.

2. Description of Related Art

A mobile phone has already been known such that a user can get an incoming call by ring alert and silent vibration (see Japanese Patent Application Publication No. H01-227535).

FIG. 1 shows a configuration of such the mobile phone 200. The mobile phone 200 is composed so as to have a micro-computer. The mobile phone 200 has a control portion 201 for controlling operations of the entire mobile phone. The control portion 201 is connected to a key operation portion 202 that allows the user to performs various kinds of operations, a display portion 203 composed of liquid crystal element that displays transmission and/or reception state of the mobile phone, and an operation state thereof, and a memory portion 204 that is used as an address book memory for storing many telephone numbers of contacts and the like.

The mobile phone 200 also has a transmission and reception antenna 205, a wireless portion 206, a baseband-processing portion 207, and an audio-processing portion 208. The wireless portion 206 performs frequency-conversion, and modulation/demodulation. The baseband-processing portion 207 performs separation/synthesis on audio information, data information and the like. The audio-processing portion 208 performs code/decode on the audio signal. The audio-processing portion 208 is connected to a speaker 209 and a microphone 210.

The mobile phone 200 further has a vibrator 212 and a vibrator-driving circuit 211 for driving the vibrator 212. The vibrator 212 has such a structure that a weight can be eccentrically attached to a drive shaft of a motor.

The following will describe reception operations of the mobile phone 200 briefly. After the antenna 205 has received a mobile phone signal (a high-frequency signal), the wireless portion 206 receives this high-frequency signal. The wireless portion 206 transforms the high-frequency signal into an intermediate-frequency signal by a mixer. The intermediate-frequency signal is then demodulated to a baseband signal. The baseband-processing portion 207 then receives this baseband signal.

The baseband-processing portion 207 separates the audio information, the data information (including image information and text information) and the like from the baseband signal. The audio information is supplied to the audio-processing portion 208. The data information is supplied to the control portion 201.

The control portion 201 performs any control operations based on the data information and controls the display portion 203 to display an image, a character and the like at need. The audio-processing portion 208 decodes the audio information to obtain an audio signal. The audio signal is supplied to the speaker 209 which sounds an audio output.

The following will describe transmission operations of the mobile phone 200 briefly. An audio signal obtained by the microphone 210 is supplied to the audio-processing portion 208. The audio-processing portion 208 codes the audio signal to obtain audio information. The audio information is supplied to the baseband-processing portion 207.

The baseband-processing portion 207 synthesizes the audio information and the data information received from the control portion 201 to obtain a baseband signal to be transmitted. This baseband signal is supplied to the wireless portion 206.

The wireless portion 206 modulates the baseband signal to obtain an intermediate-signal signal and transforms the intermediate-signal signal to a mobile phone signal (a high-frequency signal) by a mixer. The high-frequency signal is supplied to the antenna 205 which transmits the mobile phone signal.

The following will describe operations of the mobile phone 200 briefly when a user gets an incoming call. If no silent mode is set but a vibration-off mode is set in the mobile phone 200, the audio-processing portion 208 transmits audio signal for the incoming call to the speaker 209 from which the user can get the incoming call by ring alert as audio output. If a silent mode is set and a vibration-on mode is set in the mobile phone 200, the vibrator-driving circuit 211 drives the vibrator 212 by which the user can get the incoming call by its silent vibration as vibration output.

If no silent mode is set but a vibration-on mode is set in the mobile phone 200, the audio-processing portion 208 transmits audio signal for the incoming call to the speaker 209 from which the user can get the incoming call by ring alert as well as the vibrator-driving circuit 211 drives the vibrator 212 by which the user can get the incoming call by its silent vibration.

SUMMARY OF THE INVENTION

The mobile phone 200 shown in FIG. 1 has the vibrator 212 for vibrating the mobile phone 200 in addition to the speaker 209 for sounding the ring alert or the like, a structure of which may be extended only by the vibrator 212 and the speaker 209.

It is desirable to provide an electromechanical transformation device or the like that provides any one of the vibration output and the audio output or mixed outputs thereof, which has a small-scaled structure.

According to an embodiment of the invention, there is provided an electromechanical transformation device. The electromechanical transformation device has a magnetostrictive actuator, and a driving device that drives the magnetostrictive actuator. The driving device drives the magnetostrictive actuator based on any one of the vibration signal and the audio signal or the mixed signal thereof.

It is to be noted that the magnetostrictive actuator refers to an actuator using any magnetostrictive element that varies its shape when an external magnetic field is applied thereto. It is preferable that the magnetostrictive actuator contacts, for example, a part of a case of an electronics device as oscillation member.

In this embodiment of the electromechanical transformation device according to the invention, the magnetostrictive actuator provides vibration output if the magnetostrictive actuator is driven based on the vibration signal. For example, setting the vibration signal to a signal having a frequency below the range of human hearing prevents a user from hearing vibration sound thereof. Further, setting the vibration signal to an intermittent signal enables the vibration output to be made weak or strong.

The magnetostrictive actuator provides audio output if the magnetostrictive actuator is driven based on the audio signal. The magnetostrictive actuator provides mixed output of the vibration output and the audio output if the magnetostrictive actuator is driven based on the mixed signal of the vibration signal and the audio signal.

For example, adjusting a level of the vibration signal based on a level of the audio signal allows the vibration output to be made weak or strong based on an intensity of the audio output, thereby enabling the audio output and the vibration output to tune.

Thus, it is possible to provide an electromechanical transformation device or the like that provides any one of the vibration output and the audio output or mixed outputs thereof, which has a small-scaled structure by using the magnetostrictive actuator.

The concluding portion of this specification particularly points out and directly claims the subject matter of the present invention. However, those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWINGS

FIG. 5 is a block diagram for showing a configuration of an output portion of the vibration signal and the audio signal, which is an important portion of the audio-processing portion;

FIGS. 6A through 6C are diagrams for showing waveforms of the vibration signal, the audio signal, a mixed signal of them, respectively;

FIGS. 7A through 7C are diagrams for showing frequency spectra of the vibration signal, the audio signal, a mixed signal of them, respectively;

DETAILED DESCRIPTION OF PREFERRED EMBODIMENTS

Figure 1:
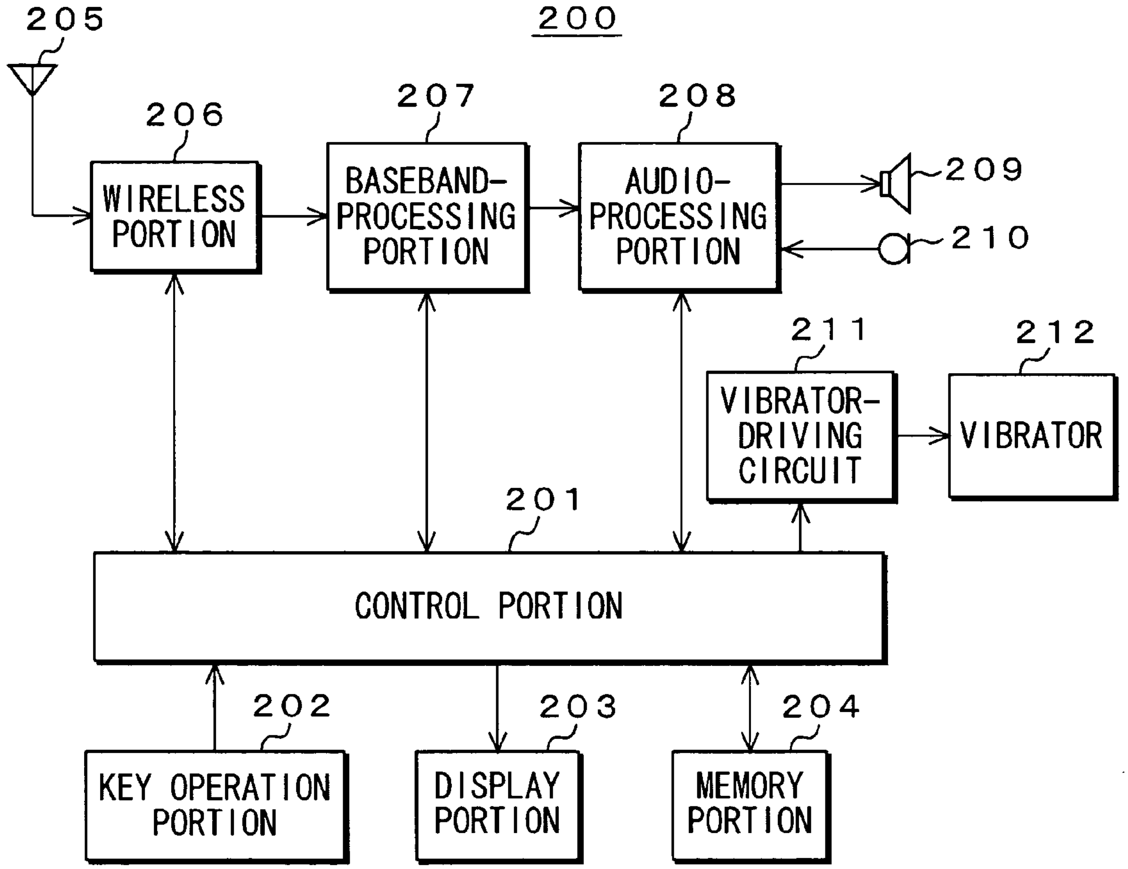
FIG. 1 (RELATED ART)
FIG. 1 is a block diagram for showing a configuration of a mobile phone according to related art.

Referring now to the drawings, an electromechanical transformation device, an electromechanical transformation method, and an electronics device using the electromechanical transformation device according to preferred embodiments of the invention will be described specifically below.

Figure 2:
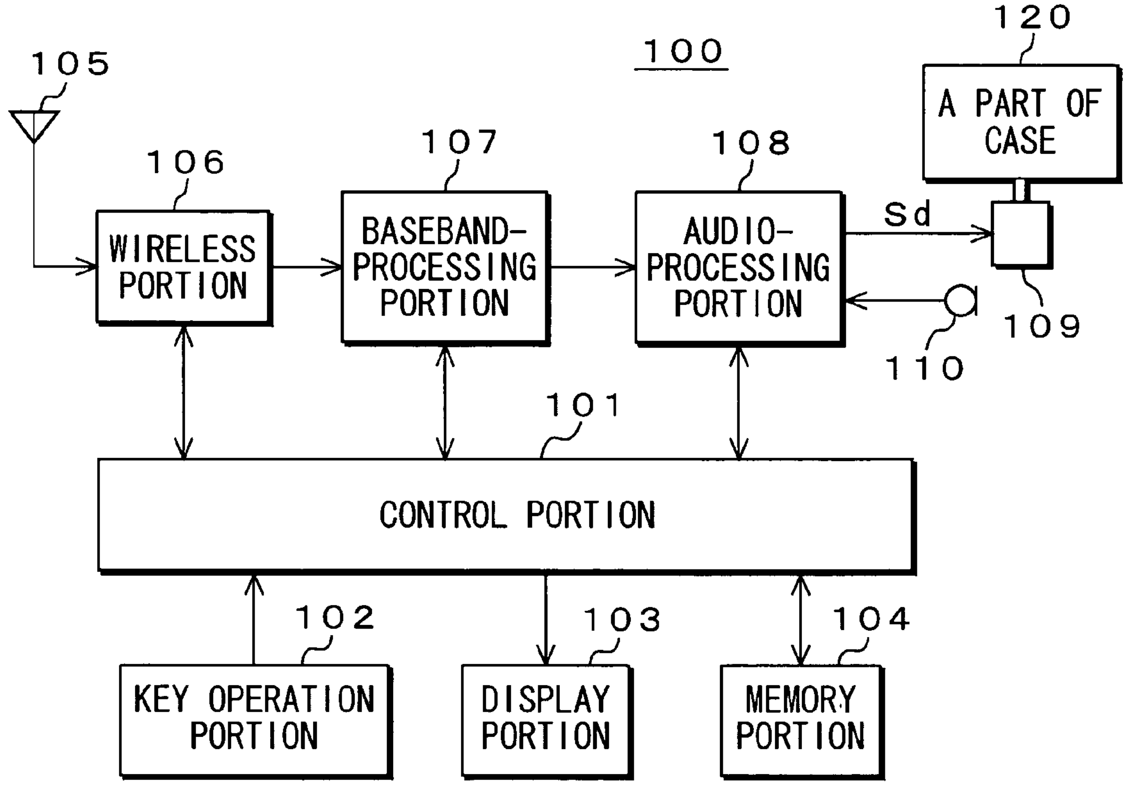
FIG. 2 is a block diagram for showing a configuration of a mobile phone according to an embodiment of the invention.

FIG. 2 shows a configuration of a mobile phone 100 according to an embodiment of the invention.

The mobile phone 100 is composed so as to have a microcomputer. The mobile phone 100 has a control portion 101 for controlling operations of the entire mobile phone. The control portion 101 is connected to a key operation portion 102 that allows the user to performs various kinds of operations, a display portion 103 composed of liquid crystal element that displays transmission and/or reception state of the mobile phone, and an operation state thereof, and a memory portion 104 that is used as an address book memory for storing many telephone numbers of contacts and the like.

The mobile phone 100 also has a transmission and reception antenna 105, a wireless portion 106, a baseband-processing portion 107, and an audio-processing portion 108. The wireless portion 106 performs frequency-conversion, and modulation/demodulation. The baseband-processing portion 107 performs separation/synthesis on audio information, data information and the like. The audio-processing portion 108 performs code/decode on the audio signal. The audio-processing portion 108 is connected to a magnetostrictive actuator 109 and a microphone 110. The magnetostrictive actuator 109 contacts a part of a case 120 of the mobile phone 100, for example, an acrylic liquid crystal panel constituting a display portion 103.

Figure 3:
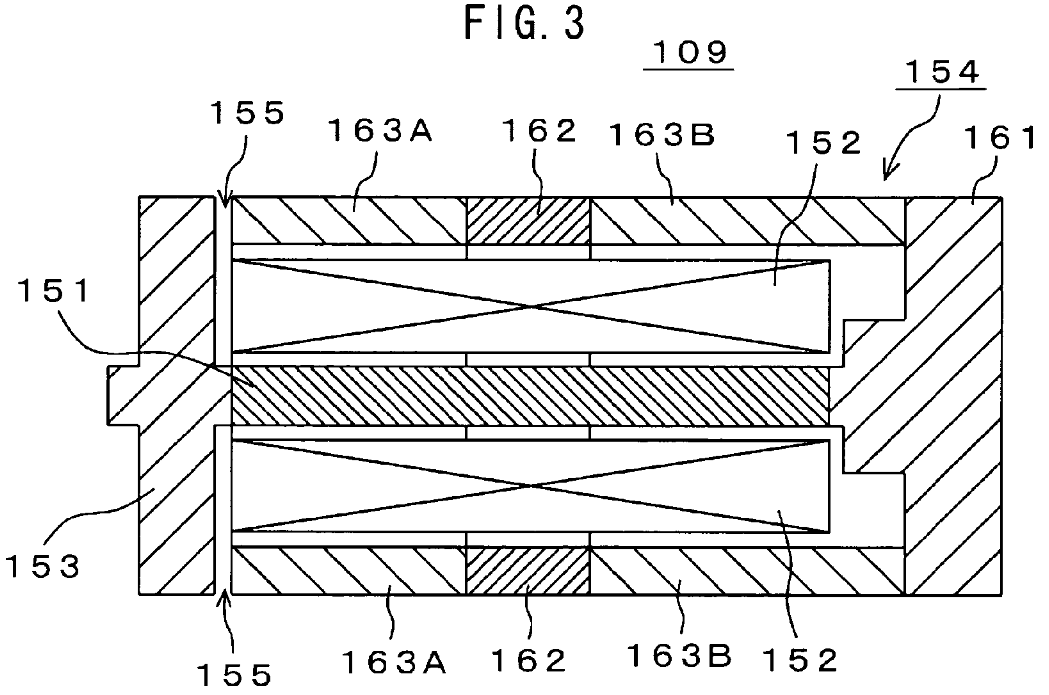
FIG. 3 is a schematically sectional view of a magnetostrictive actuator.

FIG. 3 shows a configuration of the magnetostrictive actuator 109. The magnetostrictive actuator 109 has a rod-like magnetostrictive element 151 that produces any displacement along its length when subjected to a magnetic field; a solenoid coil 152, which is arranged around the magnetostrictive element 151, that produces a control magnetic field applied to the magnetostrictive element 151; a driving member 153, which is connected to an end of the magnetostrictive element 151, that transmits any displacement produced by the magnetostrictive element 151, and a container 154 that contains the magnetostrictive element 151 and the solenoid coil 152.

A supporting disk 161, a permanent magnet 162, and tube-like cases 163A, 163B constitute the container 154. The supporting disk 161 contacts the other end of the magnetostrictive element 151 to support the magnetostrictive element 151. The permanent magnet 162, which applies a biased static magnetic field to the magnetostrictive element 151, and the tube-like cases 163A, 163B, which constitute a magnetic circuit, are arranged around the magnetostrictive element 151 in the container 154. The tube-like case 163A is attached to the permanent magnet 162 at an end thereof on a side of its driving member 153. The tube-like case 163B is attached to the permanent magnet 162 at the other end thereof on a side of its supporting disk 161. Using a ferromagnetic material as the tube-like cases 163A, 163B enables the biased static magnetic field to be efficiently applied to the magnetostrictive element 151. Using a ferromagnetic material as the supporting disk 161 enables the biased static magnetic field to be more efficiently applied to the magnetostrictive element 151.

There is a clearance 155 between the driving member 153 and the container 154. The ferromagnetic material is used as the driving member 153 so that the permanent magnet 162 attracts the driving member 153. This causes magnetic power of attraction to occur between the driving member 153 and the container 154. The magnetic power of attraction applies a load previously to the magnetostrictive element 151 that is attached to the driving member 153.

Figure 4:
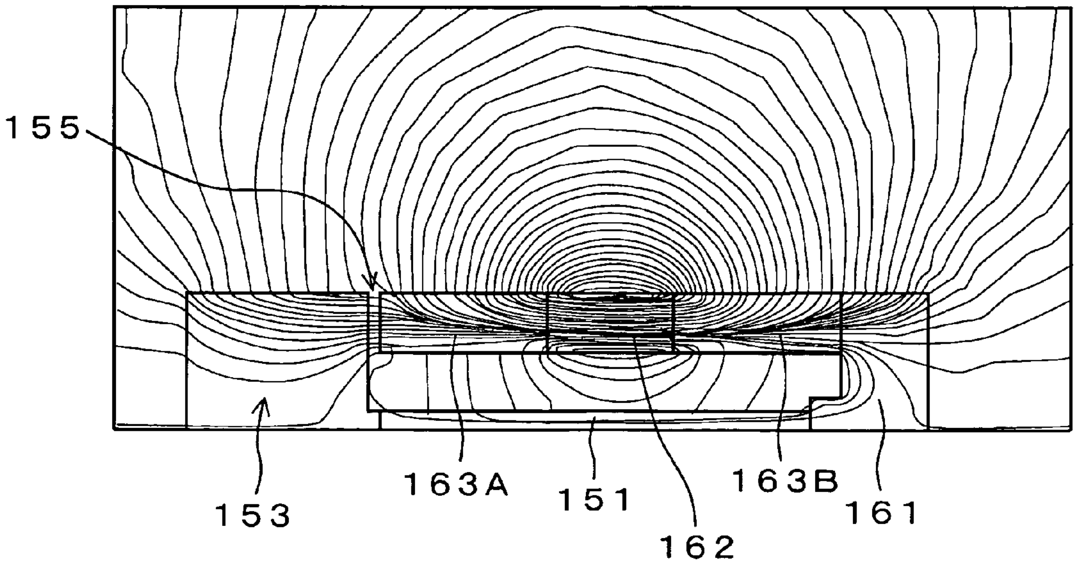
FIG. 4 is a diagram for showing a magnetic flux of the magnetostrictive actuator.

FIG. 4 shows a magnetic flux of the magnetostrictive actuator 109. The magnetic flux comes out the permanent magnet 162 passing through the tube-like case 163A, the clearance 155, and the driving member 153 and comes back to the permanent magnet 162 passing through the supporting disk 161 and the tube-like case 163B. This causes the magnetic power of attraction to occur between the driving member 153 and the container 154, thereby applying a load previously to the magnetostrictive element 151 by the magnetic power of attraction.

A part of the magnetic flux comes out the permanent magnet 162 passing through the tube-like case 163A, the clearance 155, and the driving member 153, and the magnetostrictive element 151 comes back to the permanent magnet 162 passing through the supporting disk 161 and the tube-like case 163B. This allows a biased static magnetic field to be applied to the magnetostrictive element 151.

In this embodiment of the magnetostrictive actuator 109, the driving member 153 is not supported by a bearing. Therefore, no friction occurs between the driving member 153 and the bearing. This allows a loss of displacement output of the magnetostrictive actuator 109 to be vastly decreased. In this embodiment of the magnetostrictive actuator 109, the magnetic power of attraction applies a load previously to the magnetostrictive element 151. Thus, it is possible to continue a load to be previously applied to the magnetostrictive element 151 stably even if a period of displacement of the magnetostrictive element 151 is short. This enables the magnetostrictive actuator 109 to produce a displacement output correctly according to a control current supplied to the solenoid coil 152.

The permanent magnet 162 is arranged between two tube-like cases 163A, 163B, so that the magnetostrictive actuator 109 can apply the biased static magnetic field to the magnetostrictive element 151 much equally as compared with a case where a magnetostrictive actuator in which the permanent magnet is arranged at a position of the supporting disk 161 applies the magnetic field to the magnetostrictive element 151. Since a bearing for supporting the driving member 153, a connection for connecting the driving member 153 with the container 154, and a spring for applying a load previously to the magnetostrictive element 151 are not necessary in this magnetostrictive actuator 109. This allows the magnetostrictive actuator 109 to be easily made small-sized and low in price.

FIG. 5 shows a configuration of an output portion of the vibration signal Sb and the audio signal Sa, which is an important portion of the audio-processing portion 108.

The output portion has a vibration signal generator 171 for generating a vibration signal Sb, a connection switch 172, an adder 173, and a driving circuit 174. The vibration signal Sb generated in the vibration signal generator 171 has a low frequency within a range of human hearing or a frequency below the range of human hearing, for example, 20 through 150 Hz. The vibration signal Sb generated in the vibration signal generator 171 can be set to an intermittent signal.

FIG. 6A shows an example of a waveform of the vibration signal Sb generated in the vibration signal generator 171. FIG. 7A shows an example of a frequency spectrum of the vibration signal Sb.

The connection switch 172 is connected or disconnected to the adder 173 based on a control signal SW received from the control portion 101. When the magnetostrictive actuator 109 generates vibration output, this connection switch 172 is connected to the adder 173. The adder 173 adds the audio signal Sa to the vibration signal Sb.

FIG. 6B shows an example of a waveform of the audio signal Sa. FIG. 7B shows an example of a frequency spectrum of the audio signal Sa.

For example, if the vibration signal generator 171 supplies the vibration signal Sb to the adder 173 while the connection switch 172 is connected to the adder 173 when the adder 173 has not yet received the audio signal Sa, the adder 173 transmits only the vibration signal Sb. If the vibration signal generator 171 supplies no vibration signal Sb to the adder 173 while the connection switch 172 is disconnected to the adder 173 when the adder 173 has already received the audio signal Sa, the adder 173 transmits only the audio signal Sa.

If the vibration signal generator 171 supplies the vibration signal Sb to the adder 173 while the connection switch 172 is connected to the adder 173 when the adder 173 has already received the audio signal Sa, the adder 173 transmits the mixed signal Sa+Sb of the audio signal Sa and the vibration signal Sb.

FIG. 6C shows an example of a waveform of the mixed signal Sa+Sb. FIG. 7C shows an example of a frequency spectrum of the mixed signal Sa+Sb.

The driving circuit 174 receives the output signal from the adder 173 and transmits a driving signal Sd to the magnetostrictive actuator 109 based on the output signal from the adder 173. Namely, the driving circuit 174 drives the magnetostrictive actuator 109 so that the driving circuit 174 can flow a control current corresponding to the output signal from the adder 173 to the solenoid coil 152 of the magnetostrictive actuator 109, thereby enabling the magnetostrictive actuator 109 to produce any displacement outputs corresponding to waveforms of the output signal from the adder 173.

The following will describe reception operations of the mobile phone 100 briefly. After the antenna 105 has received a mobile phone signal (a high-frequency signal), the wireless portion 106 receives the high-frequency signal. The wireless portion 106 transforms the high-frequency signal into an intermediate-frequency signal by a mixer. The intermediate-frequency signal is then demodulated to a baseband signal. The baseband-processing portion 107 then receives this baseband signal.

The baseband-processing portion 107 separates the audio information, the data information (including image information and text information) and the like from the baseband signal. The audio information is supplied to the audio-processing portion 108. The data information is supplied to the control portion 101.

The control portion 101 performs any control operations based on the data information and controls the display portion 103 to display an image, a character and the like at need.

The audio-processing portion 108 decodes the audio information to obtain an audio signal Sa. The audio signal Sa is supplied to the driving circuit 174, though the adder 173 (see FIG. 5), which transmits the driving signal Sd corresponding to the audio signal Sa to the magnetostrictive actuator 109. This enables a part of a case 120, for example, a liquid crystal acrylic panel, to be vibrated by the magnetostrictive actuator 109, thereby sounding audio outputs corresponding to the audio signal Sa.

The following will describe transmission operations of the mobile phone 100 briefly. An audio signal obtained by the microphone 110 is supplied to the audio-processing portion 108. The audio-processing portion 108 codes the audio signal to obtain audio information. The audio information is supplied to the baseband-processing portion 107.

The baseband-processing portion 107 synthesizes the audio information and the data information received from the control portion 101 to obtain a baseband signal to be transmitted. This baseband signal is supplied to the wireless portion 106.

The wireless portion 106 modulates the baseband signal to obtain an intermediate-signal signal and transforms the intermediate-signal signal to a mobile phone signal (a high-frequency signal) by a mixer. The high-frequency signal is supplied to the antenna 105 which transmits the mobile phone signal.

The following will describe operations of the mobile phone 100 briefly when a user gets an incoming call. If no silent mode is set but a vibration-off mode is set in the mobile phone 100, the adder 173 receives only the audio signal Sa for the incoming call and this audio signal Sa for the incoming call is supplied to the driving circuit 174 through the adder 173 (see FIG. 5). The driving circuit 174 transmits a driving signal Sd corresponding to the audio signal Sa for the incoming call to the magnetostrictive actuator 109. This enables a part of a case 120, for example, a liquid crystal acrylic panel, to be vibrated by the magnetostrictive actuator 109, thereby sounding an audio output (incoming call by ring alert) corresponding to the audio signal Sa for the incoming call so that the user can get the incoming call.

If a silent mode is set and a vibration-on mode is set in the mobile phone 100, the connection switch 172 is connected to the adder 173 and the adder 173 receives only the vibration signal Sb. The vibration signal Sb is supplied to the driving circuit 174 through the adder 173 (see FIG. 5). The driving circuit 174 transmits the driving signal Sd corresponding to the vibration signal Sb to the magnetostrictive actuator 109. This enables a part of a case 120, for example, a liquid crystal acrylic panel, to be vibrated by the magnetostrictive actuator 109, thereby allowing the user to get the incoming call by silent vibration of the mobile phone 100.

If no silent mode is set but a vibration-on mode is set in the mobile phone 100, the adder 173 receives only the audio signal Sa for the incoming call and the connection switch 172 is connected to the adder 173 to which the vibration signal Sb is supplied. The adder 173 transmits the mixed signal Sa+Sb of the audio signal Sa and the vibration signal Sb to the driving circuit 174 (see FIG. 5). This enables a part of a case 120, for example, a liquid crystal acrylic panel, to be vibrated by the magnetostrictive actuator 109, thereby allowing the user to get the incoming call by mixed output of the audio output (incoming call by ring alert) corresponding to the audio signal Sa for the incoming call and the vibration output corresponding to the vibration signal Sb.

Thus, according to the embodiments, the magnetostrictive actuator 109 is driven based on the any one of the audio signal Sa and the vibration signal Sb or the mixed signal Sa+Sb of them. This enables the mobile phone 100 to be easily made small-sized by using such the magnetostrictive actuator 109 that any one of the audio output and the vibration output or the mixed output of them can be implemented.

According to the embodiment of the mobile phone according to the invention, the vibration signal Sb generated by the vibration signal generator 171 can be set to, for example, a vibration signal having a frequency below the range of human hearing. This prevents a user from hearing vibration sound thereof. Further, according to another embodiment of the mobile phone according to the invention, the vibration signal Sb generated by the vibration signal generator 171 can be set to an intermittent signal. This enables the vibration output to be made weak or strong.

Although it has been described that a level of the vibration signal Sb to be supplied to the driving circuit 174 is stable, a level of the vibration signal Sb can be adjusted based on a level of the audio signal Sa. Thus, adjusting the level of the vibration signal Sb based on the level of the audio signal Sa allows the vibration output to be made weak or strong based on an intensity of the audio output, thereby allowing the audio output and the vibration output to tune.

Figure 8:
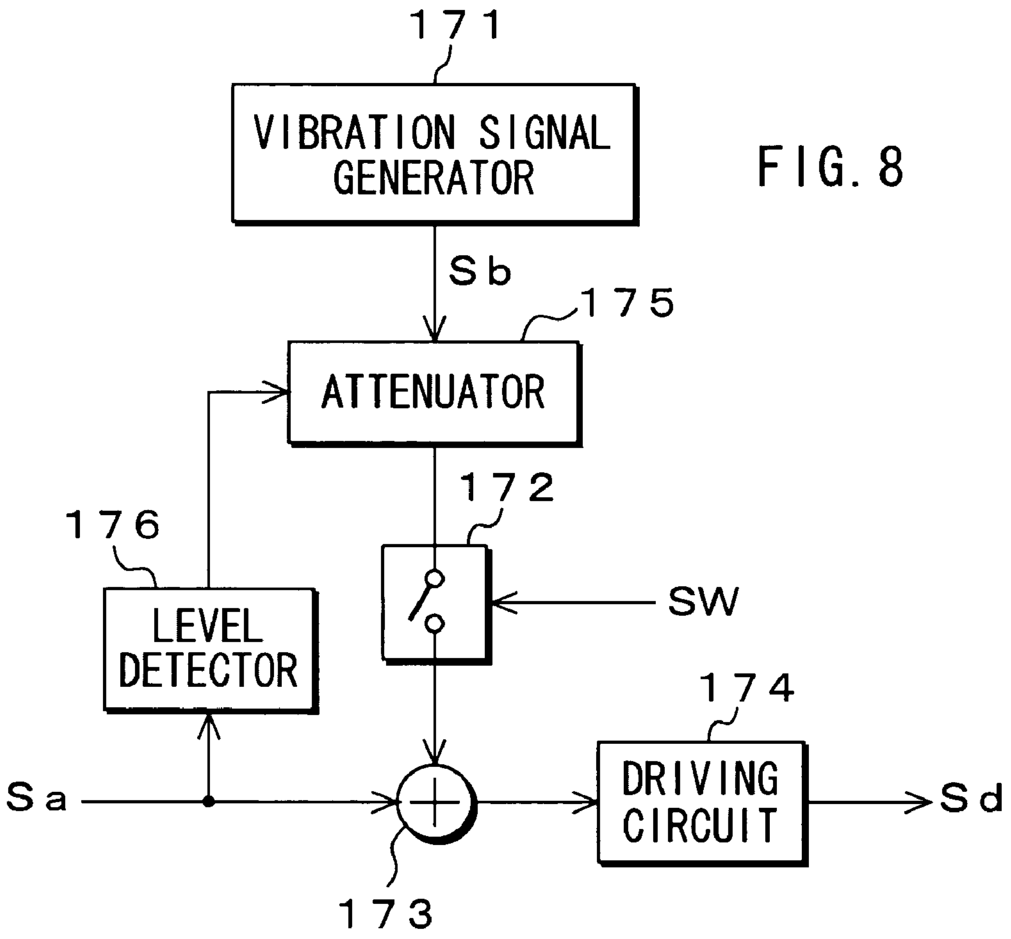
FIG. 8 is a block diagram for showing a configuration of another embodiment of an output portion of the vibration signal and the audio signal, which is an important portion of the audio-processing portion.

FIG. 8 shows a configuration of another embodiment of output portion of the vibration signal Sb and the audio signal Sa, which is an important portion of the audio-processing portion 108. In this FIG. 8, like reference characters refer to like elements shown in FIG. 5, detailed explanation of which will be omitted.

An attenuator 175 as a level adjustment device is incorporated into a portion between the vibration signal generator 171 and the connection switch 172. Further, a level detector 176 for detecting a level of the audio signal Sa is also provided. A detection output from the level detector 176 is supplied to the attenuator 175 as its control signal. In the attenuator 175, the smaller the level of the audio signal Sa, the higher a rate of the attenuation is set. Thus, the attenuator 175 transmits a vibration signal Sb having a level corresponding to the level of the audio signal Sa. This allows the vibration output to be made weak or strong based on an intensity of the audio output. It is to be noted that a variable gain amplifier or the like can be used as the level adjustment device instead of the attenuator 175.

Figure 9A:
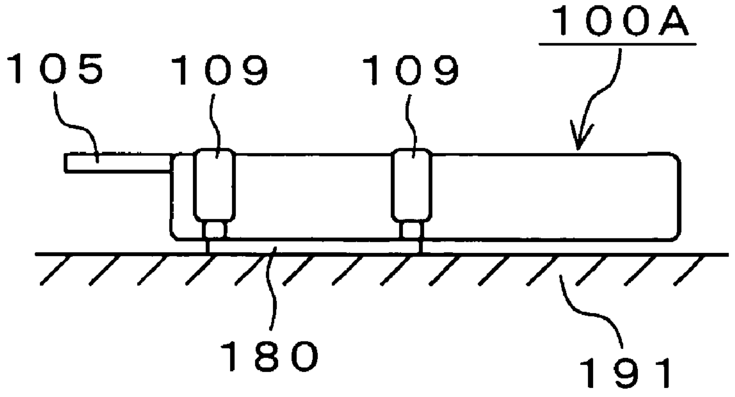
FIGS. 9A through 9C are respectively diagrams for illustrating embodiments of a mobile phone and a game machine to which the magnetostrictive actuator is applied.

FIG. 9A illustrates an embodiment of a mobile phone 100A as the electromechanical transformation device to which the magnetostrictive actuators 109, 109 are applied. In this mobile phone 100A, the magnetostrictive actuators 109, 109 respectively contact an acrylic liquid crystal panel 180 as a part of a case 120 of the mobile phone 100A, like the above-mentioned embodiments. Although two magnetostrictive actuators 109, 109 have been arranged, one magnetostrictive actuator 109 can be arranged as a matter of course. If the mobile phone 100A is put on the table 191 with a surface of the panel 180 facing a surface of the table 191 as shown in FIG. 9A, any vibrations of the panel 180 cause the table to vibrate, thereby also causing the table to obtain the audio output and the vibration output. This allows their output to be made loud. If the mobile phone 100A is removed from the table 191, the audio output and the vibration output can be naturally made low.

Figure 9B:
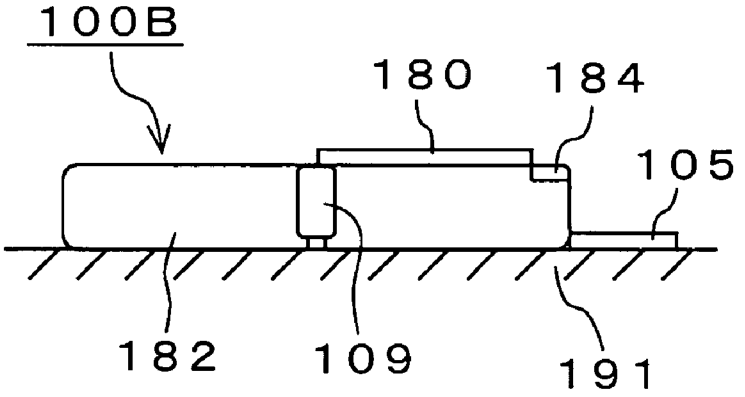

FIG. 9B illustrates an embodiment of a mobile phone 100B as the electromechanical transformation device to which the magnetostrictive actuator 109 is applied. In this mobile phone 100B, the magnetostrictive actuator 109 contacts a case 182 of the mobile phone 100B. In this embodiment, any vibrations of the magnetostrictive actuator 109 are transmitted to the entire case 182, thereby obtaining the audio output and the vibration output. If the mobile phone 100B is put on the table 191 as shown in FIG. 9B, any vibrations of the case 182 cause the table to vibrate, thereby also causing the table to obtain the audio output and the vibration output. This allows their output to be made loud. If the mobile phone 100A is leaved from the table 191, the audio output and the vibration output can be naturally made low. It is to be noted that in this embodiment, a speaker 184 for sounding audio output for telephone message can be separately arranged.

Figure 9C:
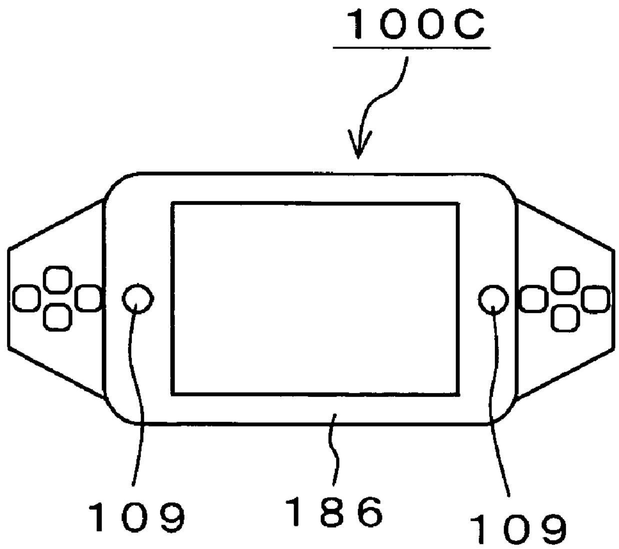

FIG. 9C illustrates an embodiment of a game machine 100C as the electromechanical transformation device to which the magnetostrictive actuator 109 is applied. In this game machine 100C, the magnetostrictive actuator 109 contacts an acrylic liquid crystal panel 186, for example. This game machine 100C can amuse any game at large volume with high tone quality even if it is small sized. Thus, audio output including any vibrations and an image allows the game machine 100C to be implemented to interact it with the user more closely.

The embodiments of the invention are preferably applied to a mobile phone and a game machine. As an embodiment of the invention, however, another electromechanical transformation device can be applied to any electronics device in order to obtain any one of a vibration output by a vibration signal and an audio output by an audio signal or mixed output thereof.

It should be understood by those skilled in the art that various modifications, combinations, sub-combinations and alternations may occur depending on design requirements and other factors insofar as they are within the scope of the appended claims or the equivalents thereof.

What is claimed is:

1. An electromechanical transformation device comprising:

a magnetostrictive actuator; and a driving device configured to drive the magnetostrictive actuator, based on an audio signal, selectively combinable with an independent vibration drive signal, wherein the intensity of the independent vibration drive signal is adjusted in accordance with a level of the audio signal.

2. The electromechanical transformation device according to claim 1 wherein the vibration signal is set to a signal having a frequency below a range of human hearing.

3. The electromechanical transformation device according to claim 1 wherein the independent vibration signal is set to an intermittent signal.

4. The electromechanical transformation device according to claim 1 wherein the magnetostrictive actuator contacts a part of a case of the electromechanical transformation device to transmit a vibration output thereof by the independent vibration signal to the electromechanical transformation device, thereby providing its sound.

5. The electromechanical transformation device according to claim 1 wherein the magnetostrictive actuator contacts a surface of a case of the electromechanical transformation device to transmit a vibration output thereof by the independent vibration signal to the electromechanical transformation device, thereby providing its sound.

6. The electromechanical transformation device according to claim 1 wherein the magnetostrictive actuator contacts a front panel of an image display portion of the electromechanical transformation device to transmit a vibration output thereof by the independent vibration signal to the electromechanical transformation device, thereby providing its sound.

7. An electromechanical transformation method comprising:

driving a magnetostrictive actuator based on an audio signal, selectively combinable with an independent vibration drive signal, wherein the intensity of the independent vibration drive signal is adjusted in accordance with a level of the audio signal.

8. An electronics device having an electromechanical transformation device comprising:

a magnetostrictive actuator; and a driving device configured to drive the magnetostrictive actuator, based on an audio signal, selectively combinable with an independent vibration drive signal, wherein the intensity of the independent vibration drive signal is adjusted in accordance with a level of the audio signal.

* * * * *